United States Patent [19]

Nazmy

[11] Patent Number: 5,180,451
[45] Date of Patent: Jan. 19, 1993

[54] PROCESS FOR THE PRODUCTION OF LONGITUDINALLY-DIRECTED COARSE-GRAINED COLUMNAR CRYSTALS IN A WORKPIECE CONSISTING OF AN OXIDE-DISPERSION-HARDENED NICKEL-BASED SUPERALLOY

[75] Inventor: Mohamed Y. Nazmy, Fislisbach, Switzerland

[73] Assignee: Asea Brown Boveri Ltd., Baden, Switzerland

[21] Appl. No.: 672,168

[22] Filed: Mar. 19, 1991

[30] Foreign Application Priority Data

Mar. 20, 1990 [CH] Switzerland .............. 920/90

[51] Int. Cl.$^5$ .............................. C22F 1/10
[52] U.S. Cl. ...................... 148/675; 148/676
[58] Field of Search ............. 148/11.5 N, 11.5 P, 148/13, 13.1, 126.1, 675, 676, 513, 514; 419/19, 29

[56] References Cited

U.S. PATENT DOCUMENTS

| | | | |
|---|---|---|---|
| 3,746,581 | 7/1973 | Cairns et al. | 148/11.5 F |
| 4,795,507 | 1/1989 | Nazmy | 148/11.5 N |
| 5,006,163 | 4/1991 | Benn et al. | 148/410 |
| 5,067,986 | 11/1991 | Fried et al. | 148/410 |

FOREIGN PATENT DOCUMENTS

0232477 11/1986 European Pat. Off. .
0325760 12/1988 European Pat. Off. .

OTHER PUBLICATIONS

"The Effect of Heating Rate on the Recrystallization Behavior of High$\gamma$, ODS Superalloys", Jongenburger, et al., 14 pp., ODS Meeting Proceedings from Oct. 15, 1989.

Primary Examiner—R. Dean
Assistant Examiner—Margery S. Phipps
Attorney, Agent, or Firm—Burns, Doane, Swecker & Mathis

[57] ABSTRACT

Process for the production of longitudinally-directed coarse-grained columnar crystals in an oxide-dispersion-hardened nickel-based superalloy which is difficult to recrystallize, starting from a warm-kneaded fine-grained structural status, by heating to a preheating temperature $T_{pre}$, which is below the minimum recrystallization temperature $T_{rec\ min}$ necessary for the material and is at least at the solution annealing temperature of the carbides in the $\gamma$-matrix, keeping at $T_{pre}$ for 5 min to 6 h, for the purpose of isothermal annealing, and immediately heating to recrystallization temperature $T_{rec}$ at 10° to 40° C./min without prior cooling, and cooling to room temperature.

7 Claims, 6 Drawing Sheets

PROCESS FOR THE PRODUCTION OF LONGITUDINALLY-DIRECTED COARSE-GRAINED COLUMNAR CRYSTALS IN A WORKPIECE CONSISTING OF AN OXIDE-DISPERSION-HARDENED NICKEL-BASED SUPERALLOY

BACKGROUND OF THE INVENTION

1. Field of the Invention

Oxide-dispersion-hardened superalloys based on nickel which, by virtue of their outstanding mechanical properties at high temperatures, find use in the construction of thermal machines. Preferred use is as blade material for gas turbines.

The invention relates to the improvement of the mechanical properties of oxide-dispersion-hardened nickel-based superalloys, it being necessary under all circumstances to achieve a structure having coarse, longitudinally-directed columnar crystals.

In the narrower sense the invention relates to a process for the production of longitudinally-directed coarse-grained columnar crystals in a workpiece consisting of an oxide-dispersion-hardened nickel-based superalloy having a Cr content of 15.5 to 25% by weight of Cr, starting from a warm-worked fine-grained structural status.

2. Discussion of Background

In operation, gas turbine blades are exposed to complex thermal and mechanical stresses. The creep stress at high temperatures plays a dominant role here. Therefore, in the case of all of the superalloys used, the aim is to obtain the structural status of longitudinally-directed coarse columnar crystals, since with this structure the creep resistance is at its maximum because of the greatly reduced grain boundary surface except in the main stress direction. This also applies for superalloys further strengthened by intercalation of oxidic dispersed phases. Said superalloys in general now show a recrystallization mechanism which deviates from the customary "usual" behavior as determined for metallic materials. This behavior is known as "secondary recrystallization" and is initiated at a specific, well-defined constant temperature which is determined only by the alloy composition, but not by the previous history. The latter determines not the level of the recrystallization temperature but the recrystallizability to coarse grain per se, i.e. the ability or inability of the material to be converted at all into the status of coarse longitudinally-directed columnar crystals.

In the case of certain oxide-dispersion-hardened nickel-based superalloys the phenomenon is now found that, despite prior optimum harmonic treatment, they display only a slight tendency or no tendency at all to "secondary recrystallization", i.e. to form coarse crystals, during the subsequent annealing at "recrystallization temperature". In other words: these alloys cannot be brought by any pretreatment (selection of the compacting and extrusion temperature, the extrusion conditions, the "proportion of cold-working" during thermomechanical shaping, etc.) into a condition in which the propulsion or the grain boundary energy of the fine-grained material is sufficient to guarantee coarse crystals, having a main dimension of at least a few mm, over the entire cross-section of the workpiece on final annealing. The material either does not recrystallize at all, or it recrystallizes as fine grains (particle diameter of a few $\mu$m) or only partially as coarse grains (at the edges or at the start of rods). The workpiece which is produced from the fine-grained material and is in its final form or near-final form is thus unusable.

It was observed that this phenomenon, which greatly restricts the field of use for gas turbine blades subject to high stress, is apparently linked to the composition of the material. In addition to the Cr content, the C content and the content of elements (Ti, Zr, Ta, Hf) which form thermodynamically very stable carbides, even in small amounts and variations in amount, apparently play an important role. Despite taking various hypotheses as the starting point, it has not yet been possible to uncover clear, unambiguous and systematic relationships.

The following publication is cited in respect of the prior art:

C. P. Jongenburger, K. Lempenauer and E. Arzt, "The effect of heating rate in the Recrystallization behavior of high $\gamma'$, ODS Superalloys", Fall Meeting, USA, Oct. 1–5, 1989

SUMMARY OF THE INVENTION

The object on which the invention is based is to indicate a process for the production of longitudinally-directed coarse-grained columnar crystals in a workpiece consisting of an oxide-dispersion-hardened nickel-based superalloy having a Cr content of 17.5 to 25% by weight of Cr, starting from a warm-worked fine-grained structural status, which process leads to success under all circumstances, including in the case of superalloys which usually are recrystallized with difficulty, or are not recrystallized, to coarse grain, irrespective of the previous history of the material and irrespective of the dimensions of the workpiece, and yields reproducible results without additional mechanical or thermomechanical treatment. The process should be economical and should be possible to be carried out inexpensively on workpieces of any desired shape using conventional equipment, without additional costly expenditure.

This object is achieved in that, in the process mentioned initially, the workpiece is subjected to the following heat treatment:

preliminary experiment to determine the recrystallizability of the material, by subjecting a series of samples to different heating rates $\dot{T}_1 \ldots \dot{T}_2 \ldots \dot{T}_3 \ldots \dot{T}_4 \ldots$ ($\dot{T} = 2\dot{\sigma}$) and determining the type of recrystallization, i.e. establishing whether, with rising $\dot{T}$, starting from very low values, the fraction of the sample volume which is recrystallizable to coarse grain decreases above a critical hearing rate $\dot{T}_c$ and finally reaches the value zero, which indicates material difficult to recrystallize, which falls under said process, heating the workpiece at an arbitrary heating rate to a preheating temperature $T_{pre}$, which is at least 5° C. below the minimum recrystallization temperature necessary for the material, $T_{rec\ min}$, and is at least at the minimum solution annealing temperature for that in the $\gamma$-matrix, maintaining the workpiece at the preheating temperature $T_{pre}$ for the purpose of isothermal annealing for at least 5 min and at most 6 h, immediate heating of the workpiece at a heating rate of between 10° C./min and 40° C./min to the recrystallization temperature $T_{rec}$ without prior cooling, and cooling the workpiece to room temperature at a cooling rate of between 5° C./min and 200° C./min.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings. FIGS. 1 to 7 relate to the preliminary experiments to precede the process according to the invention. FIGS. 8, 9 and 10 relate to the actual invention. In the drawings

DESCRIPTION OF THE PREFERRED EMBODIMENTS

Referring now to the drawings, wherein like reference numerals designate identical or corresponding parts throughout the several views, FIGS. 1a–d are a diagrammatic perspective view of cylindrical test pieces and an inductive heating device for heating without movement. The test pieces 1 for the preliminary experiment, which are to be cut out from the workpiece to be recrystallized (semi-finished product, bar, plate etc.) in the preferred main direction, have a cylindrical shape of, preferably, 10 ... 15 ... 20 mm diameter and approximately the same height. The individual test pieces 1 are provided with numerals I ... II ... III ... IV ... etc and are placed individually, in succession, in an inductive heating device (wire coil already operated with high frequency) 2 and, without carrying out any movement, are heated statically in situ in such a way that the temperature as far as possible is the same at any point in time over the entire volume of the sample. The operation is carried out using a different heating rate $\dot{T} = \partial T / \partial t$, which, however, is constant for each experiment. The operation is started using very low values for $\dot{T}$ and with each sample this value is increased successively: $\dot{T}_1 \ldots \dot{T}_2 \ldots \dot{T}_3 \ldots \dot{T}_4 \ldots$ etc. The results are established systematically in respect of recrystallization behavior (coarse grain formation) for each test piece 1 after it has cooled, using the methods of physical metallurgy and metallography.

Figure 1A:
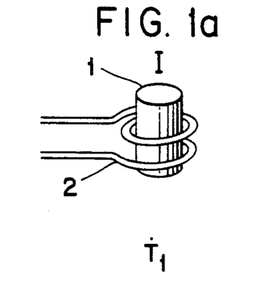
FIGS. 1a–d shows a diagrammatic perspective view of cylindrical test pieces and an inductive heating device for heating without movement.
Figure 1B:
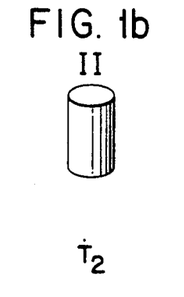
Figure 1C:
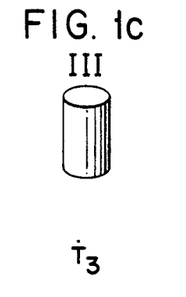
Figure 1D:
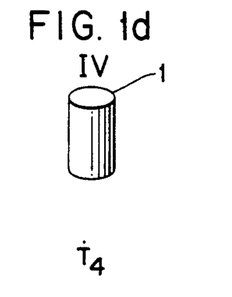
Figure 2:
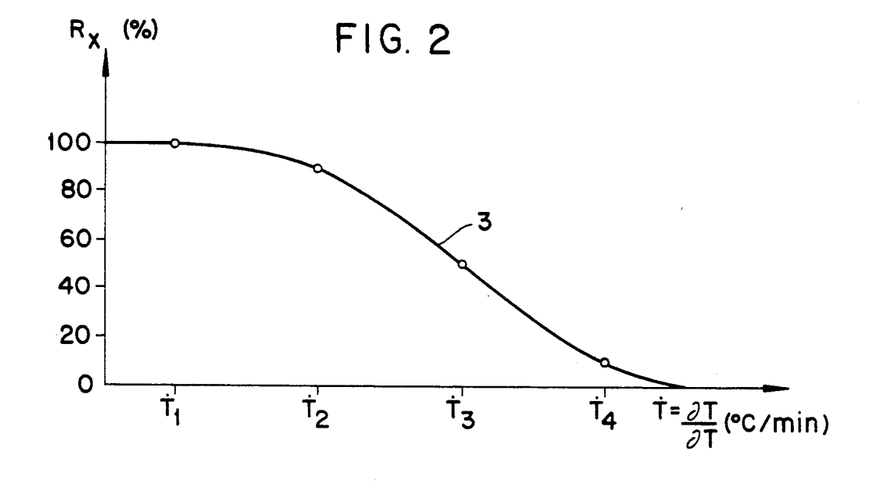
FIG. 2 shows a diagram of the change in the volume fraction recrystallized as coarse grains, as a function of the heating rate.

FIG. 2 shows a diagram of the change in the volume fraction recrystallized as coarse grains, as a function of the heating rate. The results of the experiments described under FIG. 1 are plotted in a graph. 3 is the change in the volume fraction recrystallized as coarse grains, $R_x$, for all samples as a function of the heating rate $\dot{T} = \partial T / \partial t$. If the material displays the behavior shown in FIG. 2 (100% by volume recrystallized at lower heating rate, medium fraction at medium heating rate and 0% by volume recrystallized at higher heating rate), it is to be rated as "difficult to recrystallize" or, under industrial conditions, "non-recrystallizable category" and falls under the process according to the invention described below for the production of directed coarse crystallites.

Figure 3A:
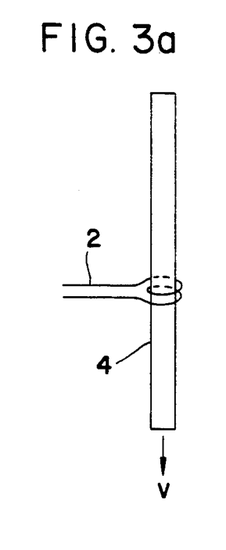
FIGS. 3a–c shows rod-shaped test piece and an inductive heating device for heating in a continuous process, and also the temperature and recrystallization conditions.
Figure 3B:
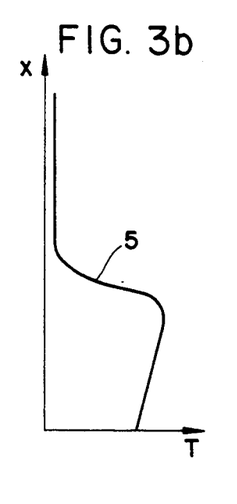

FIG. 3a shows a rod-shaped test piece and an inductive heating device for heating in the continuous process, as well as the temperature and recrystallization conditions. In this case, a rod-shaped test piece 4, preferably of circular cross-section, is cut out from the workpiece to be recrystallized (bar etc.), in the preferred main direction, for the preliminary experiment. The dimensions depend on the workpiece and material to be investigated and also on the inductive heating device 2 available for the continuous process. The vertical arrow indicates the rate of advance v and its direction. As shown in FIG. 3b 5 is the change in temperature T over the longitudinal direction x (location or path) of the rod-shaped test piece. In the preliminary experiment, the test piece 4 is now moved vertically downwards through the heating device 2 at a rate of advance v starting at zero and continually increasing. At low rates of advance v and correspondingly low heating rates $\dot{T}$ at the lower end, 100% of the volume initially recrystallizes as coarse grains. At a specific higher v and higher $\dot{T}$ the recrystallized fraction decreases and finally reaches zero.

Figure 3C:
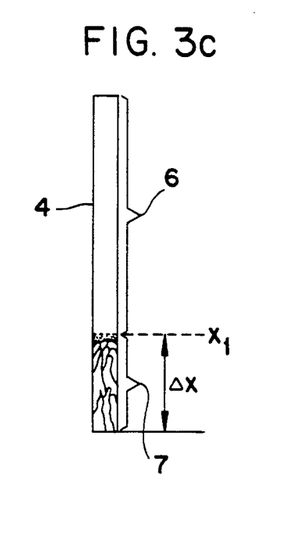
Figures 4A, 4B, 4C, 4D:
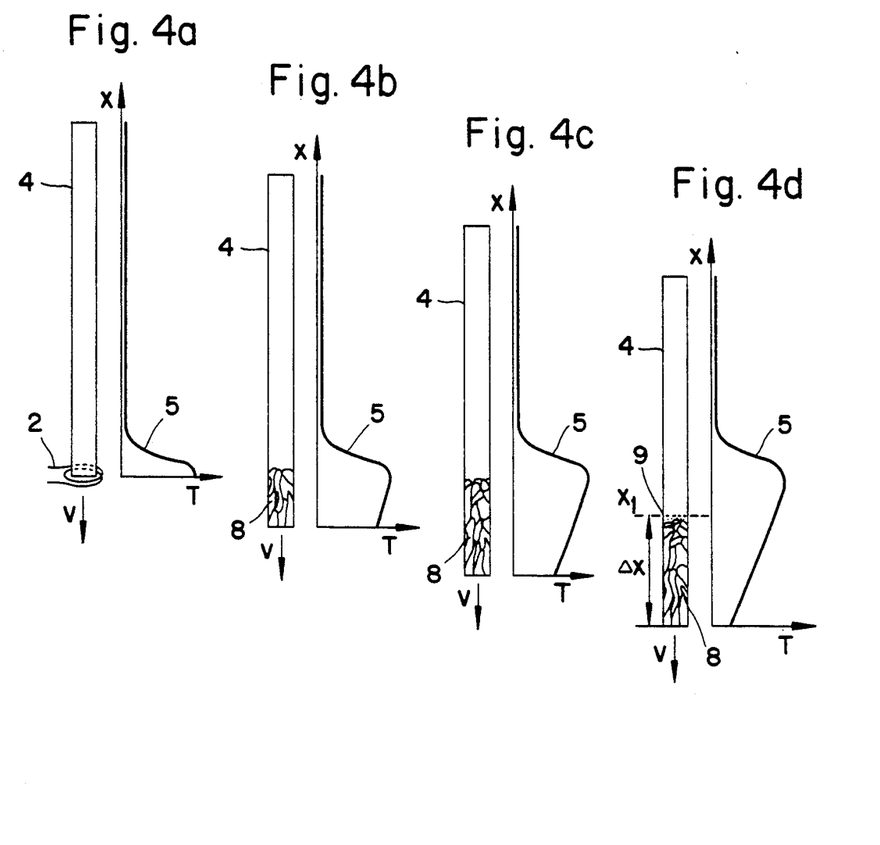
FIGS. 4a–d shows a rod-shaped test piece in the various stages of the continuous process, including change in temperature.

This point in time and the corresponding structural conditions of the test piece are shown in FIG. 3c. 6 is the fraction of the rod-shaped test piece 4 which has not recrystallized as coarse grains and is not recrystallizable at time t, or—since unchanged—also after completion of the preliminary experiment, i.e. after the test piece 4 has passed completely through the heating device 2 and has cooled. 7 is the fraction of the rod-shaped test piece 4 which has recrystallized as coarse grains: path mark or location x, and length fraction or path difference $\Delta x$.

FIGS. 4a–d show a rod-shaped test piece in the various stages of the continuous process, including change in temperature. The inductive heating device 2 and the test piece 4 correspond precisely to the reference numerals in FIG. 3a. The same applies for the variable rate of advance v and the temperature axis T and the location or path axis x. The change in temperature 5 is in each case drawn over the length of the test piece 4. The advance of the latter vertically downwards can clearly be seen in various phases. 8 are the coarse columnar crystals of the rod-shaped test piece 4. These coarse crystals, which at most cover the difference in length (path difference) Δx, end at the cross-sectional plane indicated by $x_1$. 9 therefore represents the boundary of the structure recrystallized as coarse grains in the rod-shaped test piece 4.

Figure 5A:
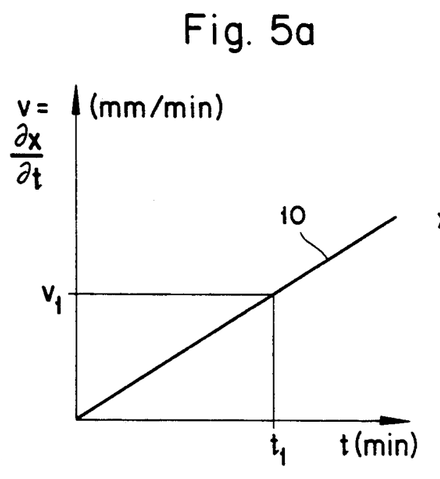
FIGS. 5a–b shows two diagrams of the relationships between the test parameters time, rate of advance and path during the preliminary experiment by the continuous process.
Figure 5B:
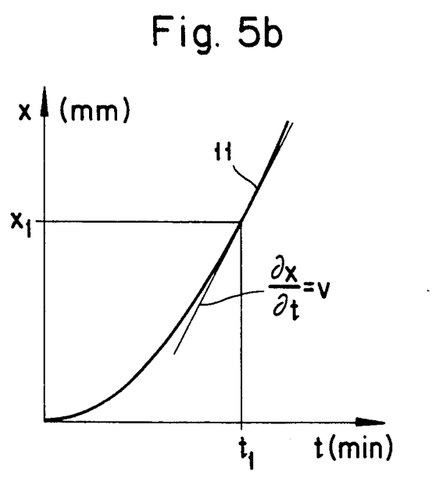

FIGS. 5a–b show two diagrams of the relationships between the test parameters time, rate of advance and path in the preliminary experiment by the continuous process. t is the time axis, v the rate axis and x the path axis. 10 shows the change in the rate of advance $v = \partial x/\partial t$ of the rod-shaped test piece 4 as a function of time t in the continuous process. The relationship is linear in this case, assuming correspondingly intended program control. 11 is the change in the path (longitudinal direction) x of the rod-shaped test piece 4 as a function of time in the continuous process. Mathematically, the resulting relationship is parabolic. $x_1$ is the path mark at which coarse grain formation ceases. $t_1$ and $v_1$ are the corresponding values for time and rate of advance.

Figure 6:
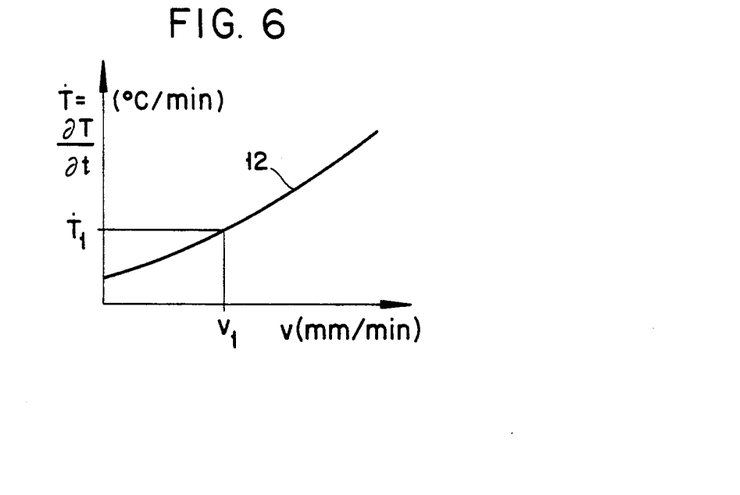
FIG. 6 shows a diagram of the relationships between the test parameters rate of advance and heating rate during the preliminary experiment by the continuous process.

FIG. 6 relates to a diagram of the relationships between the test parameters rate of advance and heating rate in the preliminary experiment by the continuous process. 12 shows the change in the heating rate $\dot{T} = \partial T/\partial t$ of the rod-shaped test piece 4 as a function of the rate of advance $v = \partial x/\partial t$ in the continuous process. In this case the relationship is assumed to be progressively rising and depends on the available power of the heating device 2, its control, the heat transfer or dissipation by radiation and a number of further test conditions. In principle it can be determined experimentally, but is not of decisive importance for the determination of the recrystallization type of the material.

Figure 7:
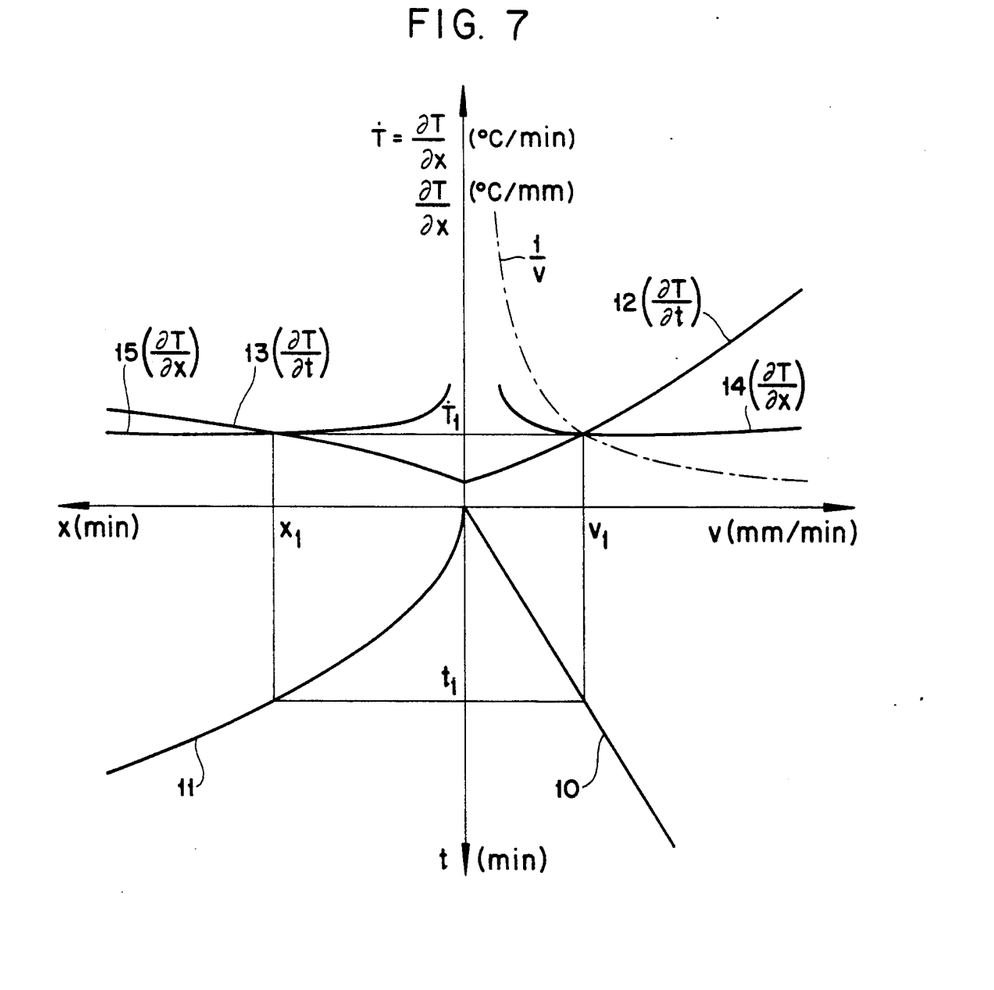
FIG. 7 shows a diagram of the relationships between the test parameters time, rate of advance, path, heating rate and temperature gradient during the preliminary experiment by the continuous process.

FIG. 7 shows a diagram of the relationships between the test parameters time, rate of advance, path, heating rate and temperature gradient in the preliminary experiment by the continuous process. This diagram is a four-quadrant representation from which all test conditions can be seen. The curve 13 of the heating rate $\dot{T} = \partial T/\partial t$ of the rod-shaped test piece 4 as a function of the path x in the continuous process results directly from the curve 12. 14 is the change in the temperature gradient $\partial T/\partial x$ of the rod-shaped test piece as a function of the rate of advance $v = \partial x/\partial t$ in the continuous process. This relationship can be derived mathematically from the equation:

$$\frac{\partial T}{\partial t} \cdot \frac{\partial t}{\partial x} = \frac{\partial T}{\partial x}, \text{ where } \frac{\partial x}{\partial t} = v$$

The function $1/v = f(v)$ is an equal-sided hyperbola and is indicated as a dot-and-dash line. The curve 15 for the temperature gradient $x1/\perp 1$ of the rod-shaped test piece 4 as a function of the path x in the continuous process results directly from the curve 14.

Figure 8:
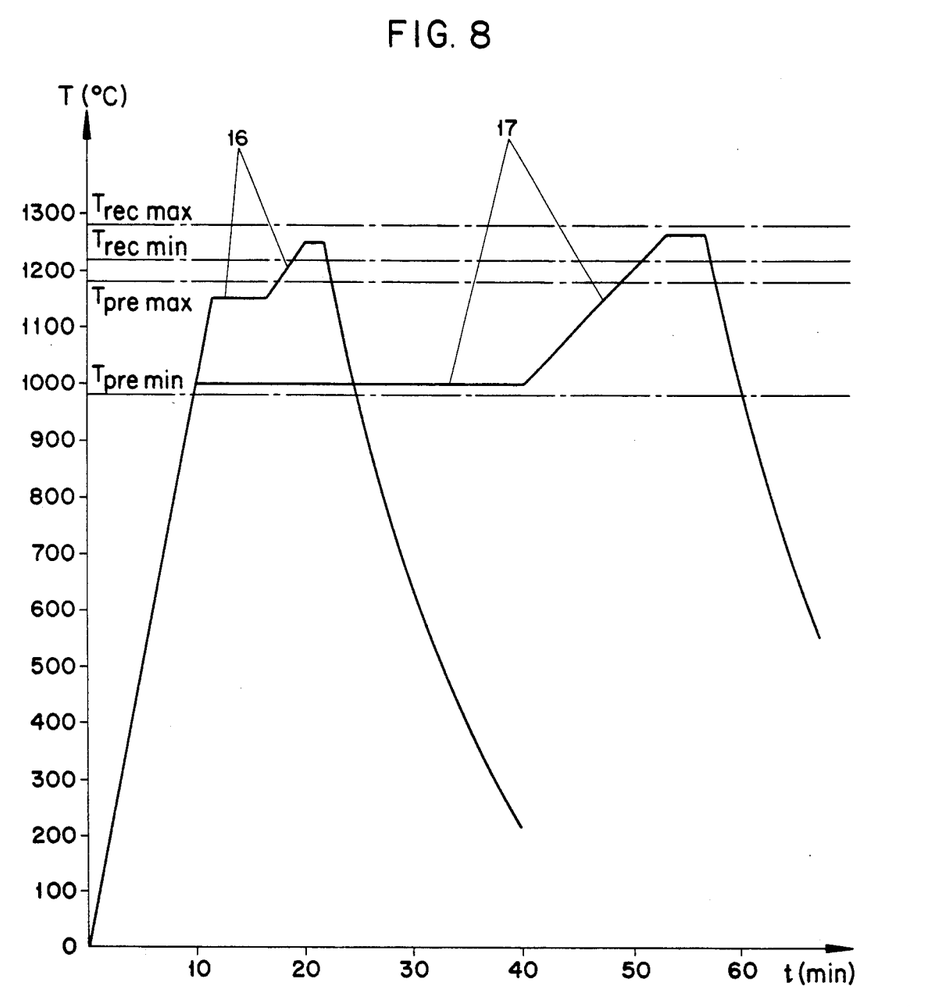
FIG. 8 shows a diagram of the change in temperature of the workpiece to be recrystallized as coarse grains as a function of the time for various preheating temperatures and preheating times for small and medium-sized workpieces.

FIG. 8 shows a diagram of the change in temperature of the workpiece to be recrystallized in coarse grains as a function of time for various pre-heating temperatures and preheating times for small and medium-sized workpieces. t is the time axis and T the temperature axis. $T_{rec\ max}$ is the maximum permissible recrystallization temperature of the materials, which still must be a few °C. below the melting point of the lowest-melting phase. $T_{rec\ min}$ is the minimum recrystallization temperature required for secondary recrystallization of the material to coarse grain. $T_{pre\ max}$ represents the maximum permissible preheating temperature (pre-annealing temperature) of the material, which must still be at least 5° C. below $T_{rec\ min}$. $T_{pre\ min}$ is the minimum preheating temperature required, which must be equal to or higher than the solution annealing temperature for the carbides in the γ-matrix of the material. 16 is the change in temperature T of the workpiece, to be recrystallized as coarse grains, as a function of time for a very high preheating temperature $T_{pre}$ and a short preheating time. This process variant is suitable for small workpieces. The heating rate up to the preheating temperature $T_{pre}$ is not critical and may be arbitrarily chosen. It is dependent only on the shape of the workpiece, its sensitivity to thermal shocks, where applicable, and the power of the pre-annealing furnace. The steepness of the curve 16 when the recrystallization temperature is exceeded can in general be chosen within the limits of 5° to 40° C./min. The preheating time to the recrystallization temperature is also not very critical. It is as a rule a few min and usually depends on the nature and power of the continuous heating device. The cooling can take place in air and is not critical, insofar as a controlled additional effect to improve the development of the structure is not desired. 17 is the change in temperature T of the workpiece, to be recrystallized as coarse grains, as a function of time for a low preheating temperature $T_{pre}$ and a medium preheating time. This variant is suitable for medium-sized workpieces, which require a longer time for warming through than those of smaller dimensions.

Figure 9:
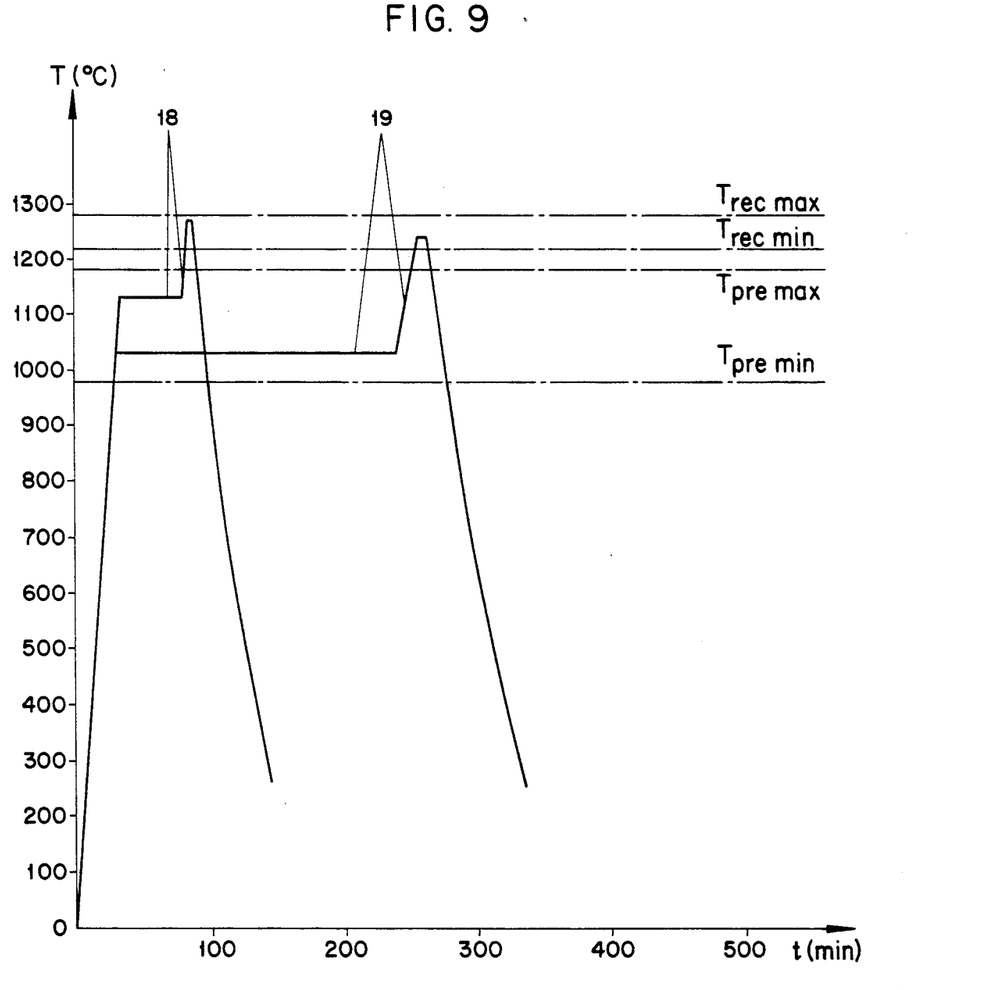
FIG. 9 shows a diagram of the change in temperature of the workpiece to be recrystallized as coarse grains as a function of the time for various preheating temperatures and preheating times for workpieces of medium and very large cross-section.

FIG. 9 shows a diagram of the change in temperature of the workpiece, to be recrystallized as coarse grains, as a function of time for various pre-heating temperatures and preheating times for workpieces of medium and very large cross-section. t is the time axis and T the temperature axis. The temperature designations correspond precisely to those in FIG. 8. 18 is the change in temperature T of the workpieces, to be recrystallized as coarse grains, as a function of time for high preheating temperatures $T_{pre}$ and a prolonged preheating time. This process variant is suitable for workpieces of medium cross-section. In other respects, the remarks made under FIG. 8 apply. 19 is the change in temperature T of the workpiece, to be recrystallized as coarse grains, as a function of time for a low preheating temperature $T_{pre}$ and a very long preheating time. This variant is suitable for workpieces of very large cross-sections, which require very long times for warming through.

Figure 10A:
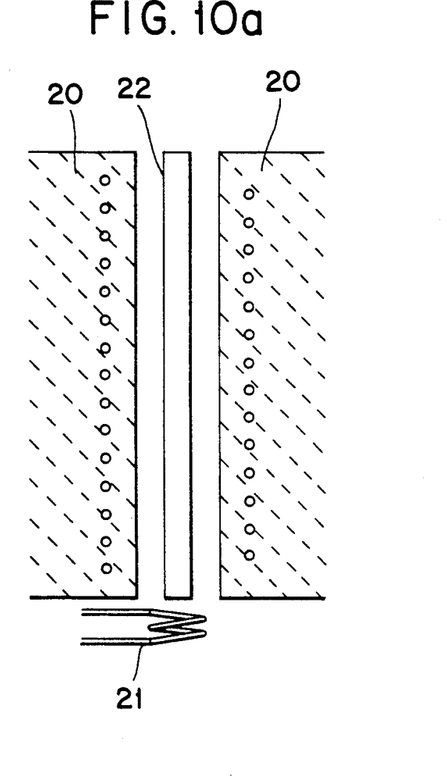
FIGS. 10a–b shows a diagrammatic outline/section of an installation for carrying out the process in two phases.
Figure 10B:
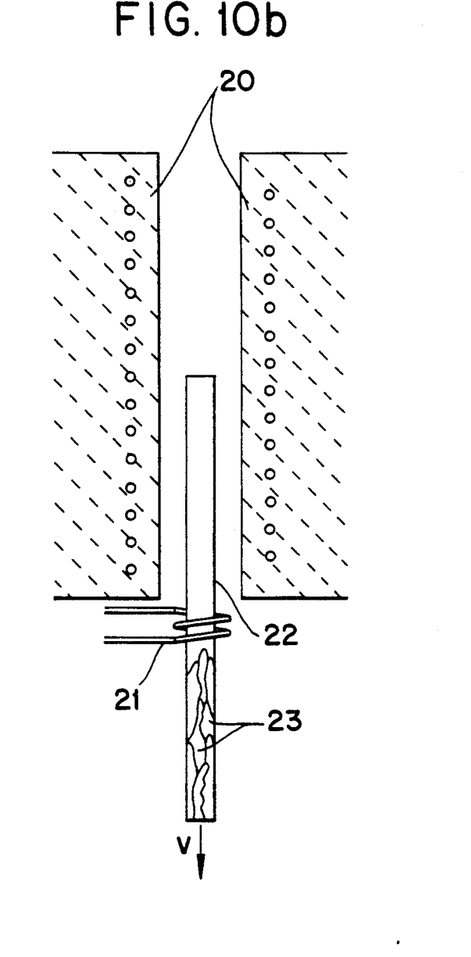

FIGS. 10a–b show a diagrammatic outline/section of an installation for carrying out the process in two phases. In FIG. 10a the preheating phase (pre-annealing) is shown. 20 is a preheating furnace (pre-annealing furnace), in which the workpiece 22 is uniformly brought to a constant preheating temperature $T_{pre}$. The preheating furnace 22 is usually fitted with resistance or induction heating and thus operates batch-wise (intermittently). 21 is an inductive heating device for the continuous process. After it has been pre-annealed in the furnace 20, the workpiece 22, which is in the form of a semi-finished or finished product, is fed successively at constant rate v through the heating coil of the heating device 21 (zone annealing process). This operation is shown in FIG. 10b. The coarse columnar crystals formed in the workpiece 22 after the recrystallization are indicated by the reference numeral 23.

ILLUSTRATIVE EMBODIMENT 1: See FIGS. 1a-d, 2, 8, 9 and 10a-b

A bar section of warm-worked fine-grained material consisting of an oxide-dispersion-hardened nickel-based superalloy of the following composition:

| | |
|---|---|
| Cr = | 20% by weight |
| W = | 3.5% by weight |
| Mo = | 2.0% by weight |
| Al = | 6.0% by weight |
| Zr = | 0.19% by weight |
| B = | 0.01% by weight |
| C = | 0.01% by weight |
| $Y_2O_3$ = | 1.1% by weight |
| Ni = | remainder | which can be recrystallized only with difficulty under normal conditions on an industrial scale, was available.

The bar had a rectangular 32 mm × 110 mm cross-section. 6 cylindrical samples 1 were cut from the bar in such a way that the cylinder axis was in each case parallel to the longitudinal axis of the bar. The samples 1 had a diameter of 18 mm and a height of 20 mm. In an inductive heating device 2, they were first heated to 1,000° C. and then brought successively, at increasing heating rates of 1° . . . to 50° C./min, to the recrystallization temperature $T_{rec}$ of 1,240° C. Whereas the first sample at 1 (I) still recrystallized completely as coarse grains at 1° C./min, it being possible to observe crystallites of 3 to 4 mm in width and up to more than 10 mm in length, at 5° C./min only about ⅓ of the volume and at 15° C./min virtually nothing further was recrystallized. The material was thus a category of material suitable for the process according to the invention (cf. FIG. 2).

The minimum recrystallization temperature $T_{rec\ min}$ of the material was 1,230° to 1,240° C. and the maximum permissible recrystallization temperature $T_{rec\ max}$ 1,280° C., corresponding to a temperature approximately 5° C. below the solidus temperature of the lowest-melting phase.

A 300 mm long bar section was now brought to the preheating temperature $T_{pre}$ of 1,100° C. at a rate of 30° C./min in a preheating furnace 20 with resistance heating and left at this temperature for a period of 30 min: isothermal annealing. The rate at which the workpiece 22 is brought to $T_{pre}$ is not critical and can be arbitrary. It is dependent only on the dimensions of the workpiece, the power of the preheating furnace 20 and the quality of the heat transfer. After the carbides had gone into solution, the workpiece 22 was brought immediately (without intermediate cooling) to the recrystallization temperature $T_{rec}$ of 1,250° C. at a heating rate $\dot{T}$ of 15° C./min. For this purpose, the continuous process was used, the workpiece 22 being moved vertically downwards successively through the coil of an inductive heating device 21 at a constant rate of advance v of 5 mm/min (zone annealing process). The temperature gradient $\partial T/\partial x$ was 3° C./mm here. The recrystallization temperature was maintained for a period of about 5 min and the workpiece 22 was cooled to room temperature at a rate of about 80° C./min immediately after issuing from the winding of the inductive heating device 22.

Metallographic examination showed complete recrystallization over the entire cross-section. The columnar crystals formed had, on average, a length of 18 mm, a width of 7 mm and a thickness of 3 mm.

ILLUSTRATIVE EMBODIMENT 2: See FIGS. 1a-b, 2, 8, 9 and 10a-b

Cylindrical samples 1 15 mm in diameter and 16 mm high were cut out from a warm-worked fine-grained bar of circular cross-section and 40 mm in diameter. The material was an oxide-dispersion-hardened nickel-based superalloy of the following composition:

| | |
|---|---|
| Cr = | 16.5% by weight |
| W = | 3.0% by weight |
| Mo = | 2.5% by weight |
| Al = | 6.5% by weight |
| Ta = | 0.8% by weight |
| Zr = | 0.17% by weight |
| B = | 0.01% by weight |
| C = | 0.03% by weight |
| $Y_2O_3$ = | 1.1% by weight |
| Ni = | remainder |

Similarly to Example 1, the samples 1 were first heated to 1,000° C. and then brought successively, at increasing heating rates, to the recrystallization temperature $T_{rec}$ of 1,200° C. The results of the recrystallized fraction $R_x$ were plotted on a graph and gave the category of the material determined for the process according to the invention, in accordance with FIG. 2.

The minimum recrystallization temperature $T_{rec\ min}$ of this material was 1,165° C. and the maximum permissible recrystallization temperature $T_{rec\ max}$ (about 5° C. below the melting point of the lowest-melting phase) 1,235° C.

A 250 mm long bar section was brought to the preheating temperature $T_{pre}$ of 1,080° C. at a rate of 50° C./min in a preheating furnace 20 with induction heating and was kept at this temperature for a period of 50 min: isothermal annealing. After dissolution of the carbides in the γ matrix of the material, the workpiece 22 was brought, without intermediate cooling, to the recrystallization temperature $T_{rec}$ of 1,200° C. at a heating rate $\dot{T}$ of 25° C./min. The workpiece 22 was drawn vertically downwards successively through the winding of an inductive heating device 21 at a constant rate of advance v of 5 mm/min (zone annealing process). The temperature gradient $\partial T/\partial x$ was 5° C./mm. The recrystallization temperature was maintained locally for a period of about 30 min and the workpiece 22 was cooled to room temperature at a rate of about 100° C./min immediately after issuing from the heating device 21.

Metallographic examination showed complete recrystallization to coarse grain over the entire cross-section. The columnar crystals formed had, on average, the dimensions 20 mm x 6 mm x 4 mm.

ILLUSTRATIVE EMBODIMENT 3: See FIGS. 3a-c, 4a-d, 8, 9 and 10a-b

A section from an extruded bar of fine-grained material consisting of an oxide-dispersion-hardened nickel-based superalloy which is usually not recrystallizable and has the following composition:

| | |
|---|---|
| Cr = | 18.5% by weight |
| W = | 3.7% by weight |
| Mo = | 2.1% by weight |
| Al = | 6.2% by weight |
| Zr = | 0.22% by weight |
| B = | 0.005% by weight |
| C = | 0.04% by weight |

-continued

| | |
|---|---|
| Y₂O₃ = | 1.05% by weight |
| Ni = | remainder | was treated.

A rod-shaped test piece 4 was first cut out from the bar for the preliminary experiment (heating in the continuous process). The test piece 4 had a circular cross-section 12 mm in diameter and a length of 160 mm. The whole was first heated uniformly to 1,000° C. in a furnace and was then drawn at continually increasing rate of advance v through the coil of an inductive heating device 2. When a heating rate of about 12° C./min was reached, virtually only fine grain was still detectable in the test piece 4 subsequently examined metallographically. The material thus showed the typical behavior predetermined for the process according to the invention (cf. FIGS. 3a–c and 4a–d).

The minimum recrystallization temperature $T_{rec\ min}$ was 1,170° C. and the maximum permissible recrystallization temperature $T_{rec\ max}$ 1,240° C.

A 280 mm long piece was cut from the bar of square cross-section and side length 55 mm and brought to the preheating temperature $T_{pre}$ of 1,100° C. at a rate of 40° C./min in a preheating furnace 20. The workpiece 22 was kept isothermally at this temperature for a period of 40 min. After the carbides had been dissolved, the workpiece 22 was brought to the recrystallization temperature $T_{rec}$ of 1,220° C. at a heating rate $\dot{T}$ of 20° C./min by drawing it vertically downwards through an inductive heating device 20 at a constant rate of advance v of 5 mm/min: zone annealing process. The temperature gradient $\partial T/\partial x$ was 4° C./mm. The recrystallization temperature was maintained locally for a period of about 4 min and the workpiece 22 was cooled to room temperature at a rate of about 80° C. after issuing from the winding of the heating device 21.

A metallographic examination showed longitudinally-directed columnar crystals of, on average, 16 mm in length, 5 mm in width and 4 mm thick.

ILLUSTRATIVE EMBODIMENT 4: See FIGS. 3a–c, 4a–d, 8, 9 and 10a–b

Similarly to Example 3, a rod-shaped test piece 4 12 mm in diameter and 100 mm long was cut from an extruded fine-grained bar of rectangular cross-section. The material was an oxide-dispersion-hardened nickel-based superalloy which is difficult to recrystallize and has the following composition:

| | |
|---|---|
| Cr = | 16.2% by weight |
| W = | 3.3% by weight |
| Mo = | 1.8% by weight |
| Al = | 6.3% by weight |
| Ta = | 1.8% by weight |
| Zr = | 0.12% by weight |
| C = | 0.07% by weight |
| Y₂O₃ = | 1.1% by weight |
| Ni = | remainder |

The procedure in the preliminary experiment was precisely the same as indicated under Example 3. The material proved clearly to belong to the category which is suitable for the application of the process according to the invention (cf. FIGS. 3a–c and 4a–d).

The minimum recrystallization temperature $T_{rec\ min}$ of this material was 1,180° to 1,100° C. and the maximum permissible recrystallization temperature $T_{rec\ max}$ 1,240° C.

A workpiece 22 having dimensions of 28 mm×75 mm×320 mm was cut from the bar and brought to the preheating temperature $T_{pre}$ of 1,115° C. in a preheating furnace 20 with resistance heating and maintained isothermally at this temperature for 120 min. The workpiece 22 was then brought successively to the recrystallization temperature $T_{rec}$ of 1,230° C. by means of an inductive heating device 20 using the zone annealing process. The heating rate $\dot{T}$ was 18° C./min, the rate of advance v 4 mm/min and the temperature gradient $\partial T/\partial x$ 4.5° C./mm. The recrystallization temperature was maintained locally for a period of about 3.5 min and the workpiece 22 was cooled to room temperature after issuing from the inductive heating device 21.

Examination showed longitudinally-directed columnar crystals of, on average, 25 mm in length, 5 mm in width and 3 mm thick.

ILLUSTRATIVE EMBODIMENT 5: See FIGS. 1a–d, 2, 8, 9 and 10a–b

A plate, in the warm-worked, pressed fine-grained state, consisting of an oxide-dispersion-hardened nickel-based superalloy which is recrystallizable only with difficulty and has the following composition:

| | |
|---|---|
| Cr = | 25% by weight |
| W = | 2.5% by weight |
| Mo = | 1.5% by weight |
| Al = | 7.0% by weight |
| Zr = | 0.1% by weight |
| B = | 0.01% by weight |
| C = | 0.02% by weight |
| Y₂O₃ = | 1.1% by weight |
| Ni = | remainder | was available.

The plate was rectangular and had dimensions of 35 mm×120 mm×350 mm. Analogously to Example 1, 8 cylindrical samples 1 were cut from said plate in such a way that the cylinder axis was coincident with the main longitudinal axis of the plate. The procedure was then precisely the same as in Example 1. The preliminary experiment showed that the material was a material category suitable for the process according to the invention (cf. FIGS. 1a–d and 2).

The minimum recrystallization temperature $T_{rec\ min}$ of this material was 1,220° to 1,230° C. and the maximum permissible recrystallization temperature $T_{rec\ max}$ 1,270° C. (about 3° C. below the solidus temperature of the lowest-melting phase). The plate was brought to the preheating temperature $T_{pre}$ of 1,090° C. at a rate of 30° C./min in a preheating furnace 20 with resistance heating and kept at this temperature for a period of 240 min: isothermal annealing. The workpiece 22 was then heat-treated by the zone annealing process (continuous process) in an inductive heating device 21. The recrystallization temperature $T_{rec}$ was 1,245° C., the heating rate $\dot{T}$ 12° C./min, the rate of advance v 2 mm/min and the temperature gradient $\partial T/\partial x$ 6° C./mm. The recrystallization temperature was ma for a period of about 5 min and the workpiece 22 was cooled to room temperature at a rate of 60° C./min immediately after issuing from the inductive heating device 21.

Metallurgical examination gave complete recrystallization to coarse grain over the entire cross-section of the workpiece 22. The longitudinally-directed columnar crystals measure, on average, 15 mm×5 mm×2.5 mm.

ILLUSTRATIVE EMBODIMENT 6: See FIGS. 1a–d, 2, 8, 9 and 10a–b

Cylindrical samples 1 were cut, in accordance with Example 1, from an extruded bar of circular cross-section 45 mm in diameter and subjected to the preliminary experiment indicated in said example (cf. FIGS. 1a–d and 2). The material was a nickel-based super-alloy which is recrystallizable only with difficulty and has the following composition:

| | |
|---|---|
| Cr = | 15.5% by weight |
| W = | 3.0% by weight |
| Mo = | 2.5% by weight |
| Al = | 6.5% by weight |
| Ta = | 1.2% by weight |
| Zr = | 0.17% by weight |
| B = | 0.01% by weight |
| C = | 0.03% by weight |
| $Y_2O_3$ = | 1.1% by weight |
| Ni = | remainder |

The minimum recrystallization temperature $T_{rec\ min}$ was 1,175° C. and the maximum permissible recrystallization temperature $T_{rec\ max}$ 1,245° C.

A 330 mm long bar section was brought to the preheating temperature $T_{pre}$ of 1,020° C. at a heating rate of 40° C./min in a preheating furnace 20 with induction heating and left at this temperature for 300 min. After the dissolution of the carbides in the γ-matrix of the material, which resulted from this isothermal annealing, the workpiece 22 was immediately brought to the recrystallization temperature $T_{rec}$ of 1,210° C. at a heating rate $\dot{T}$ of 90° C./min. The constant rate of advance v was 6 mm/min for this continuous process (zone annealing process) with the aid of an inductive heating device 21. The temperature gradient $\partial T/\partial x$ was accordingly established at a value of 5° C./mm. The recrystallization temperature was maintained locally for a period of about 3.5 min. The workpiece was then cooled to room temperature immediately after leaving the heating device 21.

Metallographically it was possible to establish longitudinally-directed columnar crystals of, on average, 22 mm in length, 6.5 mm in width and 4.5 mm thick over the entire cross-section.

The invention is not restricted to the illustrative embodiment.

The process for the production of longitudinally-directed coarse-grained columnar crystals in a workpiece consisting of an oxide-dispersion-hardened nickel-based superalloy having a Cr content of 17.5 to 25% by weight of Cr, starting from a warm-worked fine-grained structural status, is carried out by subjecting the workpiece to the following heat treatment:

preliminary experiment to determine the recrystallizability of the material, by subjecting a series of samples to different heating rates $\dot{T}_1 \ldots \dot{T}_2 \ldots \dot{T}_3 \ldots \dot{T}_4 \ldots$ ($\dot{T} = \partial T/\partial t$) and determining the type of recrystallization, i.e. establishing whether, with rising $\dot{T}$, starting from very low values, the fraction of the sample volume which is recrystallizable to coarse grain decreases above a critical heating rate $\dot{T}_c$ and finally reaches the value zero, which indicates material difficult to recrystallize, which falls under said process, heating the workpiece at an arbitrary heating rate to a preheating temperature $T_{pre}$, which is at least 5° C. below the minimum recrystallization temperature necessary for the material, $T_{rec\ min}$, and is at least at the minimum solution annealing temperature for the carbides in the γ-matrix, maintaining the workpiece at the preheating temperature $T_{pre}$ for the purpose of isothermal annealing for at least 5 min and at most 6 h, immediate heating of the material at a heating rate of between 10° C./min and 40° C./min to the recrystallization temperature $T_{rec}$ without prior cooling, and cooling the workpiece to room temperature at a cooling rate of between 5° C./min and 200° C./min.

The process is preferably applied to oxide-dispersion-hardened nickel-based superalloys which contain no, or only a low content of, elements such as Ti, Ta and Hf, which form stable carbides, and have a Cr content of 17.5 to 25% by weight. Advantageously the basis of the process is that the oxide-dispersion-hardened nickel-based superalloy has the following composition:

| | |
|---|---|
| Cr = | 20% by weight |
| W = | 3.5% by weight |
| Mo = | 2.0% by weight |
| Al = | 6.0% by weight |
| Zr = | 0.19% by weight |
| B = | 0.01% by weight |
| C = | 0.01% by weight |
| $Y_2O_3$ = | 1.1% by weight |
| Ni = | remainder. | the workpiece is first brought to a preheating temperature $T_{pre}$ of 1,100° C. at a heating rate of 100° C./min, kept at this temperature for 15 min for the purpose of isothermal annealing and then brought zone-wise to the recrystallization temperature $T_{rec}$ of 1,240° C. at a heating rate of 20° C./min, corresponding to a rate of advance v of 8 mm/min and a temperature gradient $\partial T/\partial x$ of 2.5° C./mm, in a continuous process through an inductive heating device, kept at this temperature for 2 min and finally cooled to room temperature at a cooling rate of 200° C./min.

In another variant the process consists in that the oxide-dispersion-hardened nickel-based superalloy has the following composition:

| | |
|---|---|
| Cr = | 15.5% by weight |
| W = | 3.0% by weight |
| Mo = | 2.5% by weight |
| Al = | 6.5% by weight |
| Ta = | 1.2% by weight |
| Zr = | 0.17% by weight |
| B = | 0.01% by weight |
| C = | 0.03% by weight |
| $Y_2O_3$ = | 1.1% by weight |
| Ni = | remainder, | the workpiece is first brought to a preheating temperature $T_{pre}$ of 1,050° C. at a heating rate of 50° C./min, kept at this temperature for 1 h for the purpose of isothermal annealing and then brought zone-wise to the recrystallization temperature $T_{rec}$ of 1,260° C. at a heating rate of 10° C./min, corresponding to a rate of advance of 5 mm/min and a temperature gradient $\partial T/\partial x$ of 2° C./mm, in a continuous process through an inductive heating device, kept at this temperature for 4 min and finally cooled to room temperature at a cooling rate of 100° C./min. In a further variant the process is carried out in that the oxide-dispersion-hardened nickel-based superalloy has the following composition:

| | |
|---|---|
| Cr = | 25% by weight |
| W = | 2.5% by weight |
| Mo = | 1.5% by weight |
| Al = | 7.0% by weight |
| Zr = | 0.1% by weight |
| B = | 0.01% by weight |
| C = | 0.02% by weight |
| $Y_2O_3$ = | 1.1% by weight |
| Ni = | remainder, | the workpiece is first brought to a preheating temperature $T_{pre}$ of 980° C. at a heating rate of 20° C./min, kept at this temperature for 3 h for the purpose of isothermal annealing and then brought zone-wise to the recrystallization temperature $T_{rec}$ of 1,280° C. at a heating rate of 40° C./min, corresponding to a rate of advance of 8 mm/min and a temperature gradient $\partial T/\partial x$ of 5° C./mm, in a continuous process through an inductive heating device, kept at this temperature for 5 min and finally cooled to room temperature at a cooling rate of 80° C./min.

It should be pointed out that the level of the preheating temperature $T_{pre}$ and the period of isothermal pre-annealing (preheating) depend on the composition of the material in detail (slight differences can play a role) and on its previous history. The degree of warm-working (compression ratio), rate of deformation (extrusion speed) and deformation temperature (extrusion temperature) play a decisive role here. On the one hand, the preheating temperature $T_{pre}$ must be sufficiently high to bring the carbides into solution; on the other hand, it must not be chosen too high, in order not unduly to lower the propulsion (grain boundary energy), which is required for the coarse grain recrystallization annealing to be carried out subsequently. In no case may the preheating temperature $T_{pre}$ reach or even exceed the minimum temperature of secondary recrystallization $T_{rec\ min}$. The period of isothermal pre-annealing must be at least so long that the carbides dissolve in the $\gamma$-matrix, but not too long, so that the propulsion does not substantially decline or undesired uncontrollable grain growth take place, so that any subsequent secondary recrystallization is impossible.

Obviously, numerous modifications and variations of the present invention are possible in light of the above teachings. It is therefore to be understood that, within the scope of the appended claims, the invention may be practiced otherwise than as specifically described herein.

What is claimed as new and desired to be secured by Letters Patent of the United States is:

1. A process for the production of longitudinally oriented coarse-grained columnar crystals in a workpiece consisting of an oxide-dispersion-hardened nickel-based superalloy having a Cr content of 15.5 to 25% by weight of Cr, wherein the workpiece is subjected to the following heat treatment:
   providing the workpiece in a warm-worked fine-grained condition;
   heating the workpiece at a heating rate to a preheating temperature $T_{pre}$, which is at least 5° C. below the minimum recrystallization temperature necessary for the material, $T_{rec\ min}$, and is at least at the minimum solution annealing temperature for carbides in the $\gamma$-matrix;
   maintaining the workpiece at the preheating temperature $T_{pre}$ for the purpose of isothermal annealing for at least 5 min;
   immediately heating the workpiece at a heating rate of between 10° C./min and 40° C./min to the recrystallization temperature $T_{rec}$ without prior cooling; and
   cooling the workpiece to room temperature at a cooling rate of between 5° C./min and 200° C./min.

2. The process as claimed in claim 1, wherein the oxide-dispersion-hardened nickel-based superalloy is free of elements which form stable carbides.

3. The process as claimed in claim 1, wherein the oxide-dispersion-hardened nickel-based superalloy has the following composition:

| | |
|---|---|
| Cr = | 20% by weight |
| W = | 3.5% by weight |
| Mo = | 2.0% by weight |
| Al = | 6.0% by weight |
| Zr = | 0.19% by weight |
| B = | 0.01% by weight |
| C = | 0.01% by weight |
| $Y_2O_3$ = | 1.1% by weight |
| Ni = | remainder. | and wherein the workpiece is first brought to a preheating temperature $T_{pre}$ of 1,100° C. at a heating rate of 100° C./min, kept at this temperature for 15 min for the purpose of isothermal annealing and then heating the workpiece by zone annealing to the recrystallization temperature $T_{rec}$ of 1,240° C. at a heating rate of 20° C./min, the zone annealing being performed by subjecting the workpiece to a rate of advance of 8 mm/min and a temperature gradient of 2.5° C./mm, in a continuous process through an inductive heating device, kept at this temperature for 2 min and finally cooled to room temperature at a cooling rate of 200° C./min.

4. The process as claimed in claim 1, wherein the oxide-dispersion-hardened nickel-based superalloy has the following composition:

| | |
|---|---|
| Cr = | 15.5% by weight |
| W = | 3.0% by weight |
| Mo = | 2.5% by weight |
| Al = | 6.5% by weight |
| Ta = | 1.2% by weight |
| Zr = | 0.17% by weight |
| B = | 0.01% by weight |
| C = | 0.03% by weight |
| $Y_2O_3$ = | 1.1% by weight |
| Ni = | remainder, | and wherein the workpiece is first brought to a preheating temperature $T_{pre}$ of 1,050° C. at a heating rate of 50° C./min, kept at this temperature for 1 h for the purpose of isothermal annealing and then heating the workpiece by zone annealing to the recrystallization temperature $T_{rec}$ of 1,260° C. at a heating rate of 10° C./min, the zone annealing being performed by subjecting the workpiece to a rate of advance of 5 mm/min and a temperature gradient of 2° C./mm, in a continuous process through an inductive heating device, kept at this temperature for 4 min and finally cooled to room temperature at a cooling rate of 100° C./min.

5. The process as claimed in claim 1, wherein the oxide-dispersion-hardened nickel-based superalloy has the following composition:

| | |
|---|---|
| Cr = | 25% by weight |
| W = | 2.5% by weight |
| Mo = | 1.5% by weight |
| Al = | 7.0% by weight |
| Zr = | 0.1% by weight |
| B = | 0.01% by weight |
| C = | 0.02% by weight |
| $Y_2O_3$ = | 1.1% by weight |
| Ni = | remainder, | and wherein the workpiece is first brought to a preheating temperature $T_{pre}$ of 980° C. at a heating rate of 20° C./min, kept at this temperature for 3 h for the purpose of isothermal annealing and then heating the workpiece by zone annealing to the recrystallization temperature $T_{rec}$ of 1,280° C. at a heating rate of 40° C./min, the zone annealing being performed by subjecting the workpiece to a rate of advance of 8 mm/min and a temperature gradient of 5° C./mm, in a continuous process through an inductive hating device, kept at this temperature for 5 min and finally cooled to room temperature at a cooling rate of 80° C./min.

6. The process as claimed in claim 1, wherein the oxide-dispersion-hardened nickel-based superalloy contains a maximum of about 1.8 wt % total of Ti, Ta and Hf.

7. The process as claimed in claim 1, wherein the oxide-dispersion-hardened nickel-based superalloy contains a maximum of about 0.8 wt % total of Ti, Ta and Hf.

* * * * *